United States Patent
Boswell et al.

(10) Patent No.: US 6,563,297 B1
(45) Date of Patent: May 13, 2003

(54) RF ISOLATION TEST DEVICE HAVING EASE OF ACCESSIBILITY

(75) Inventors: Bryan D. Boswell, Loveland, CO (US); John L. Bidwell, Fort Collins, CO (US); Russell S. Krajec, Berthoud, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/511,732

(22) Filed: Feb. 23, 2000

(51) Int. Cl.[7] .................... G01R 31/00; H01K 9/00
(52) U.S. Cl. .................. 324/158.1; 174/35 MS
(58) Field of Search .................. 324/754, 761, 324/158.1, 765, 760; 73/431; 174/35 R, 35 MS

(56) References Cited

U.S. PATENT DOCUMENTS

| | | | | |
|---|---|---|---|---|
| 3,970,934 A | * | 7/1976 | Aksu | 324/754 |
| 4,623,132 A | * | 11/1986 | Smith | 267/34 |
| 4,812,754 A | * | 3/1989 | Tracy et al. | 324/754 |
| 4,939,454 A | | 7/1990 | Miner | 324/158 F |
| 4,961,050 A | | 10/1990 | Harwood et al. | 324/158 F |
| 5,300,881 A | | 4/1994 | Ferrer et al. | 324/158 F |
| 5,321,351 A | | 6/1994 | Swart et al. | 324/158 F |
| 5,408,189 A | | 4/1995 | Swart et al. | 324/758 |
| 5,416,405 A | | 5/1995 | Dill | 324/72.5 |
| 5,436,567 A | | 7/1995 | Wexler et al. | 324/754 |
| 5,492,223 A | | 2/1996 | Boardman et al. | 206/710 |
| 5,572,144 A | | 11/1996 | Davidson et al. | 324/755 |
| 5,715,167 A | | 2/1998 | Gupta et al. | 364/474.28 |
| 5,831,160 A | * | 11/1998 | Steketee | 324/754 |
| 6,007,057 A | * | 12/1999 | Fuhrmann et al. | 267/64.15 |

OTHER PUBLICATIONS

EMC Test System, LP, Bench–Top Test Cells 5200 Series, http://www.emctest.com/emchtm/BenchTopTestCells.cfm, 1997.

* cited by examiner

*Primary Examiner*—Ernest Karlsen

(57) ABSTRACT

A radio frequency (RF) isolation test device providing versatility and flexibility, along with RF shielding, in the testing of various types of devices. The RF isolation test device provides for ease of accessibility by having a pivoting handle which locks the test device closed and provides for quickly opening of the test device, also assisted through gas springs.

20 Claims, 14 Drawing Sheets

RF ISOLATION TEST DEVICE HAVING EASE OF ACCESSIBILITY

REFERENCE TO RELATED APPLICATIONS

The present application is related to the following applications, all of which are incorporated herein by reference as if fully set forth: United States patent application of Russell S. Krajec, entitled "Adjustable Electrical Connector for Test Fixture Nest," and filed Nov. 17, 1999; United States patent application of Russell S. Krajec and Wallace J. Lannen, entitled "Signal Transfer Device for Probe Test Fixture," and filed Nov. 17, 1999; United States patent application of Russell S. Krajec, John L. Bidwell, and William R. Miner, entitled "Customizable Nest for Positioning a Device Under Test," and filed Jan. 18, 2000; United States patent application of Bryan D. Boswell, John L. Bidwell, and Russell S. Krajec, entitled "RF Isolation Test Device Having a Box Within a Box Configuration for RF Shielding and a Low Resonance Test Environment," and filed on even date herewith; United States patent application of Bryan D. Boswell, John L. Bidwell, and Russell S. Krajec, entitled "RF Isolation Test Device Accommodating Multiple Nest Plates for Testing Different Devices and Providing Variable Testing Options," and filed on even date herewith; United States patent application of Rick T. Euker, entitled "Customizable Nest That Requires No Machining or Tools," and filed on even date herewith; United States patent application of Rick T. Euker, entitled "Customizable Nest Providing for Adjustable Audio Isolation for Testing Wireless Devices," and filed on even date herewith; and United States patent application of Rick T. Euker, entitled "Customizable Nest With the Option of Conversion to a Permanent Nest," and filed on even date herewith.

FIELD OF THE INVENTION

The present of invention relates to an apparatus for testing devices requiring shielding from radio frequency (RF) energy.

BACKGROUND OF THE INVENTION

Testing of certain devices such as cellular telephones requires shielding of the devices from ambient RF energy. The shielding is required to both ensure that external RF energy does not interfere with the device under test, and also to ensure that the device being tested does not generate RF energy that interferes with other devices. Certain devices exist for such testing, and they include, for example, devices for automatic testing on an assembly line. These devices typically include a robotic arm that loads the device under test into a testing drawer that provides RF shielding and, upon completion of the test, automatically removes the device from the testing drawer and replaces it back onto the assembly line. These automatic testing devices, however, do not have portability and thus cannot be easily moved from one site to another for testing.

Certain portable testing devices do exist for testing of RF devices. However, these testing devices typically do not have ease of accessibility for the testing, and usually do not have options for different types of testing or for use with different types of devices under test. Therefore, these testing devices must be custom made for each device to be tested. Accordingly, a need exists for an RF isolation test device having more versatility and flexibility in the options that it provides for testing.

SUMMARY OF THE INVENTION

An RF isolation test device consistent with the present invention includes an upper outer enclosure and a lower outer enclosure mating with the upper outer enclosure. The upper and lower outer enclosures provide for RF shielding of a device under test located within the test device when they are mated together. An open-close mechanism permits the upper and lower outer enclosures to open for access within the test device and to close for testing of the device under test, and the open-close mechanism includes an assist mechanism that assists a user in opening and closing the test device.

Another RF isolation test device consistent with the present invention includes an upper outer enclosure and a lower outer enclosure mating with the upper outer enclosure. The upper and lower outer enclosures provide for RF shielding of a device under test located within the test device when they are mated together. The test device also includes a handle and a corresponding locking element, operably attached to the upper and lower outer enclosures, for use in opening the upper and lower outer enclosures and for locking them closed in order to test the device under test located within the test device.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Overview

Figure 1:
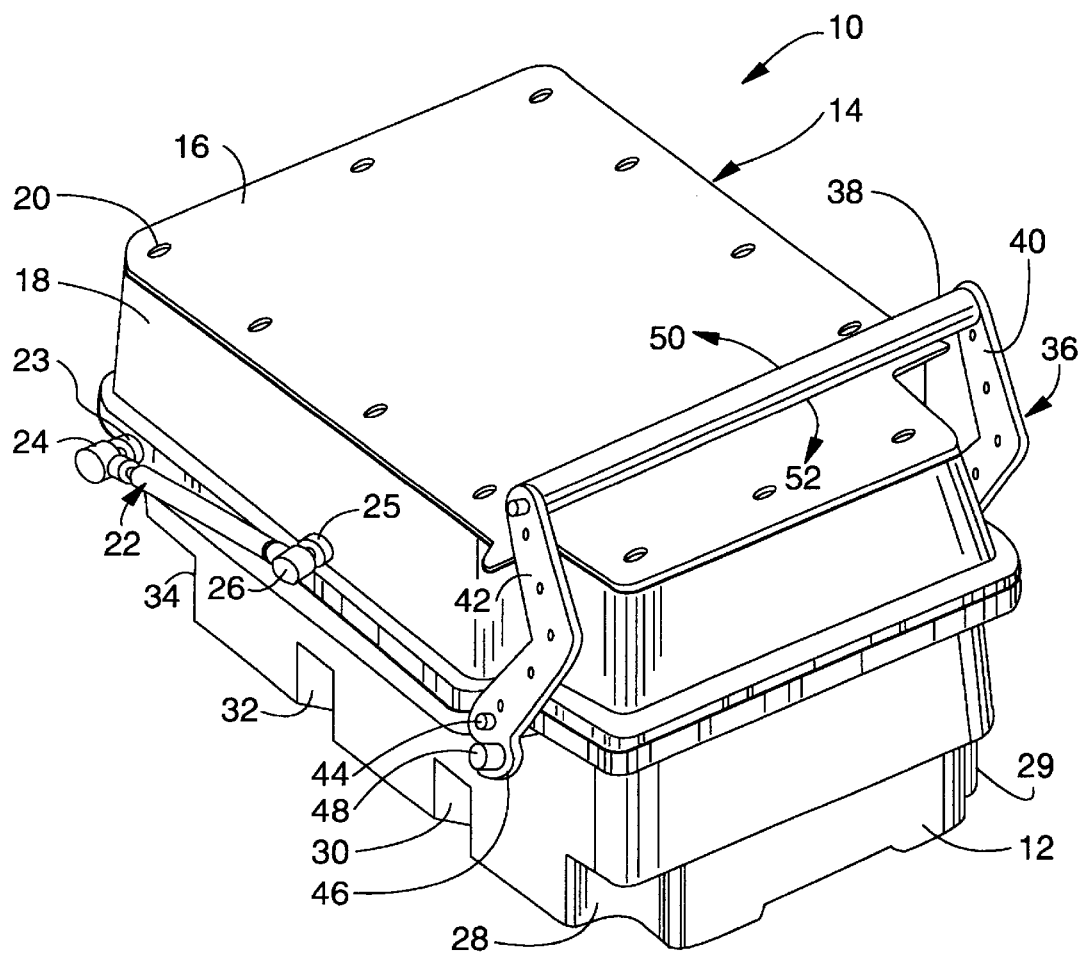
FIG. 1 is a perspective view of an RF isolation test device.

An RF isolation test device, also referred to as "test device," consistent with the present invention provides for versatility and various options in testing of a device under test. It provides for portability and ease of accessibility for rapid and easy testing of devices at a various locations. Also, it provides for shielding of a device under test from ambient RF electromagnetic energy, and preventing RF electromagnetic energy from the device under test from interfering with other devices.

A device under test used within the test device can include any type of device requiring or benefitting from shielding from RF energy. Examples include wireless devices such as cellular telephones, pagers, satellite telephones, and Internet appliances. The RF shielding provides for a low resonance test environment, and it thus helps to approximate ideal testing conditions simulating energy-free space. The test device uses metallic components and structure for the RF shielding, and it provides for electrical connection to the device under test while being tested. The test device may also provide for interfacing a manufacturing line and control of automation such as pneumatic actuators.

Test devices consistent with the present invention, as further explained below, implement features to provide for this RF shielding, low resonance test environment, ease of use, and various testing options. One test device consistent with the present invention provides for ease of accessibility when testing devices. It includes an upper outer enclosure and a lower outer enclosure mating with the upper outer enclosure. The upper and lower outer enclosures provide for RF shielding of a device under test located within the test device when they are mated together. The test device also includes an open-close mechanism permitting the upper and lower outer enclosures to open for access within the test device and to close for testing of the device under test. The open-close mechanism can include an assist mechanism that assists a user in opening and closing the test device. The open-close mechanism can include a handle and a corresponding locking element, operably attached to the upper and lower outer enclosures, for use in opening them and locking them closed in order to test the device under test located within the test device.

Another test device consistent with the present invention has a "box within a box" configuration for different types of RF shielding. It includes a first enclosure for primary shielding of the device under test. The first enclosure includes an upper outer enclosure and a lower outer enclosure mating with the upper outer enclosure. The upper and lower outer enclosures provide for RF shielding of a device under test located within the test device when they are mated together. The test device also includes a second enclosure, within the first enclosure, for providing additional secondary RF shielding of the device under test and RF absorption to create a low resonance test environment. The second enclosure includes an upper inner enclosure and a lower inner enclosure mating with the upper inner enclosure when they are closed together.

Another test device having a "box within a box" configuration includes a first enclosure and a second enclosure located within the first enclosure. The first enclosure has at least two enclosures opening to provide access to the second enclosure and closing to shielding the device under test. The second enclosure also has at least two enclosures opening to provide access to the second enclosure and the device under test and closing to shielding the device under test.

Another test device consistent with the present invention provides for various testing options. It includes an upper outer enclosure and a lower outer enclosure mating with the upper outer enclosure. The upper and lower outer enclosures provide for RF shielding of a device under test located within the test device when they are mated together. To provide for testing options, the test device also includes a removable plate fastened to the lower outer enclosure. The removable plate includes connections for access to the device under test when located within the test device.

Another test device having testing options can accommodate different types of devices under test. It includes an upper outer enclosure and a lower outer enclosure mating with the upper outer enclosure. The upper and lower outer enclosures provide for RF shielding of a device under test located within the test device when they are mated together. The test device also includes a base plate for use in securing a removable nest plate within the test device to accommodate testing of various configurations of the device under test. Nest plates may include, for example, the nest plates described in the related applications identified above.

The enclosures of the test device may include structures that fully enclose or partially enclosure a device under test or other component, either alone or in combination. For example, the test device may include two enclosures that in combination fully enclose a device under test. Alternatively, the two enclosures may substantially enclose the device under test, allowing for some nominal leakage of RF energy. Also, as identified above, an enclosure may enclose the device under test directly, or enclose another enclosure for the "box within a box" configuration.

Outer Enclosure

FIG. 1 is a perspective diagram of a test device 10. Test device 10 is further illustrated in the various views shown in FIGS. 2–6. As shown in FIG. 1, and the other views in FIGS. 2–6, test device 10 includes two outer enclosures, a lower outer enclosure 12 and an upper outer enclosure 14. Outer enclosures 12 and 14 are typically composed of a metallic material in order to provide for RF shielding. Examples of metallic materials for implementing metallic components of test device 10 include aluminum, cast aluminum, and any other type of metal providing RF shielding. Upper outer enclosure 14 in this example includes two pieces, a cover 16 mounted on a portion 18. Cover 16 is mounted to portion 18 through a plurality of closely-spaced fasteners, such as screws, located within apertures on cover 16, such as aperture 20. The number and spacing of the fasteners is such as to provide sufficient force to ensure a good seal between cover 16 and portion 18 of upper outer enclosure 14. Cover 16 may also be formed from a metallic material. Use of a cast metallic material, for example, avoids seams that may otherwise allow leakage of RF energy.

Upper and lower outer enclosures 12 and 14 lock together through use of a handle 36. Handle 36 is typically formed from a metallic material or any material with sufficient strength and durability for its function of opening and closing test device 10. Handle 36 includes a handle bar 38 to be grasped by a user for opening and closing test device 10. Handle 36 also includes brackets 40 and 42 attached to handle bar 38. Brackets 40 and 42 are mounted for rotation on upper outer enclosure 14 and, in particular, on portion 18. For example, as shown, bracket 42 is mounted to a pivot point 44, and bracket 40 would likewise include a pivot point on the opposite side of upper outer enclosure 14. Each bracket also includes a hook, such as hook 46 for bracket 42. When test device 10 is in a closed position, each hook engages a cylindrical element protruding from lower outer enclosure 12, such as a cylindrical element 48. Cylindrical element 48 protrudes a sufficient distance from the side of lower outer enclosure 12 to engage hook 46.

The cylindrical elements, shown as metal pins in this example, constitute locking elements. Cylindrical element 48, and a corresponding one on the other side of lower outer enclosure 12, engage the hooks on handle 36 such that rotation of the hooks about the cylindrical elements causes downward pressure on upper outer enclosure 14, locking it against lower outer enclosure 12. The hooks in combination with the handle assembly provide the mechanical advantage to close upper outer enclosure 14 to lower outer enclosure 12. The term "locking element" includes any apparatus for locking closed a test device to prevent inadvertent opening of it or to provide an enclosure for RF shielding.

In order to open test device 10, handle 36 is moved in the direction shown by arrow 50, and in so doing hook 46 disengages cylindrical element 48. When handle 36 disengages the cylindrical elements, upper outer enclosure 14 may pivot open through hinges on the back of upper and lower outer enclosures 14 and 12. In order to close test device 10, upper outer enclosure 14 is lowered and handled 36 is moved in the direction shown by arrow 52 such that hook 46 engages cylindrical element 48 and such that an identical hook on bracket 40 would engage a corresponding cylindrical element.

Therefore, handle 36 in combination with cylindrical element 48, and another corresponding cylindrical element, constitutes an open-close mechanism for opening and closing test device 10 when moved, respectively, in directions 50 and 52. The term "open-close" mechanism includes any apparatus for use in opening and closing a test device. The use of handle 36 for an open-close mechanism provides for ease of accessibility of test device 10 by permitting a user to open test device 10 with one motion and close it with another. Furthermore, a user need only use, for example, one hand grasping handle 36 on handle bar 38 to open and close test device 10. This feature permits the user to have another hand free for placing a device under test within test device 10. A handle for implementing handle 36 may include alternative structures and configurations; handle 36 is shown with brackets 40 and 42 having an angled shape in order to provide leverage to a user in opening and closing test device 10.

Figure 2:
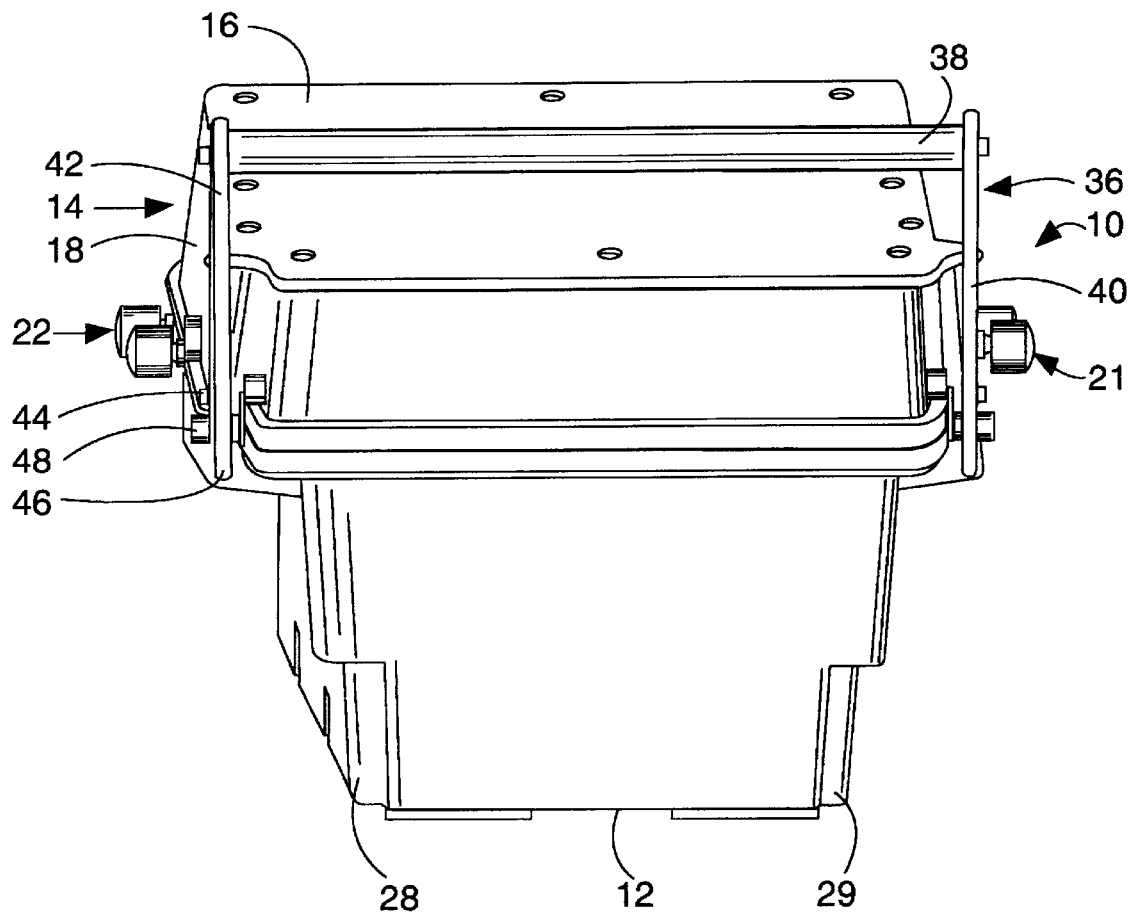
FIG. 2 is a front view of the RF isolation test device.

To assist in the opening of test device 10, and to maintain the test device 10 open, test device 10 includes an assist mechanism. The term "assist mechanism" refers to any apparatus used to assist a user in opening a test device and potentially maintain it in an open position. In this example, test device 10 includes an assist mechanism through use of a pair of gas springs, such as gas spring 22. Gas spring 22 includes two end portions 24 and 26. Those two end portions include a plastic receptacle that snaps onto a metal ball protruding from elements 23 and 25 in order to attach to, respectively, lower outer enclosure 12 and upper outer enclosure 14. Another gas spring 21, as shown in FIG. 2, is mounted in a similar manner. Gas springs 21 and 22 assist a user in opening test device 10 by applying pressure tending to force apart lower outer enclosure 12 and upper outer enclosure 14. Also, the gas springs apply sufficient pressure to maintain test device 10 in a open position when fully opened. This feature permits, for example, a user to have both hands free for placing a device under test in test device 10 or for performing other work.

Lower outer enclosure 12 in this example also includes indented portions 28, 29, 30, 32, and 34, and additional symmetrical indented portions hidden from view. As explained below, these indented portions provide for mounting points on the inside of lower outer enclosure 12. The term "indented portion" refers to any internal structure providing a mounting point for attaching a lower inner enclosure or other structure for use in testing, and the indented portions are sometimes referred to as a "stand-off."

Figure 3:
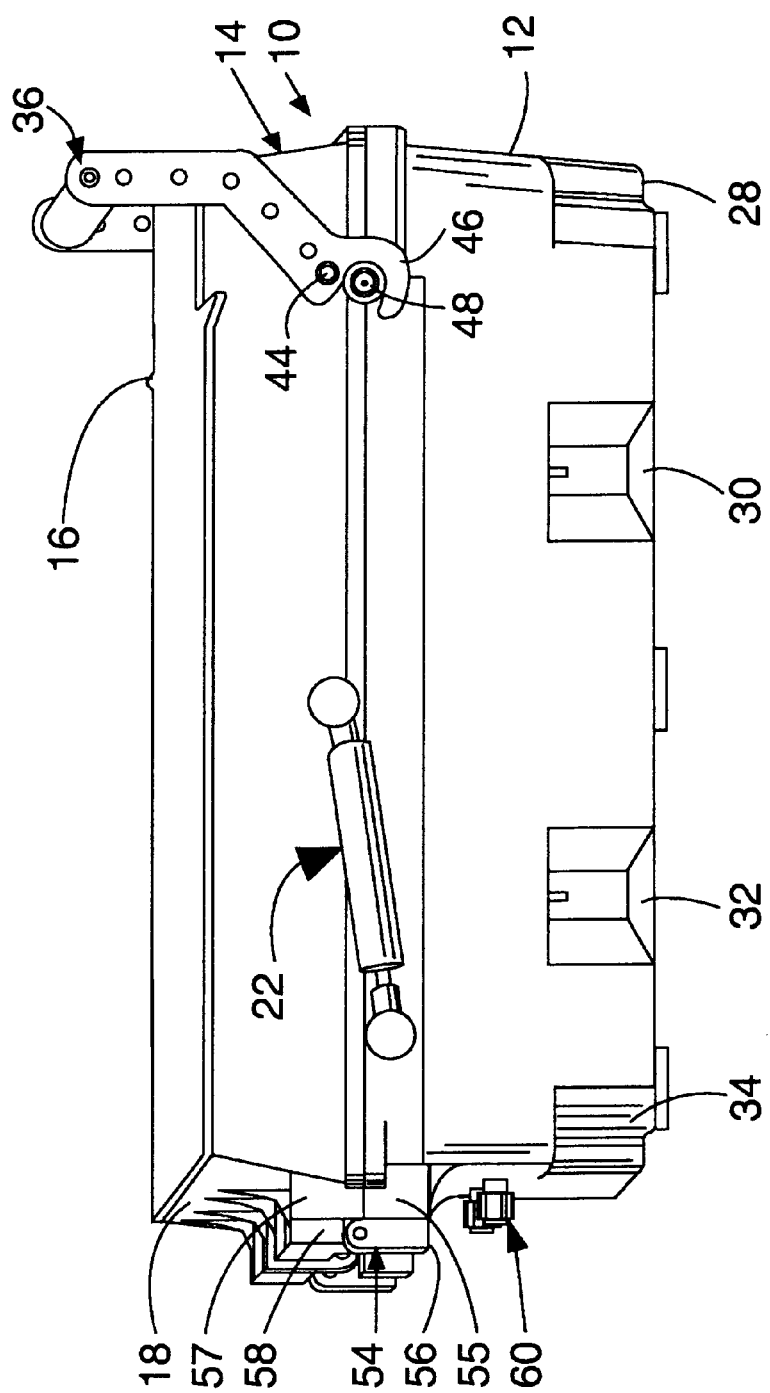
FIG. 3 is a side view of the RF isolation test device.

FIG. 2 is a front view of test device 10 further illustrating detail for handle 36 and also showing the second gas spring 21. FIG. 3 is a side view of test device 10 further illustrating detail of test device 10. In particular, the side view shows a hinge 54 on the back of the test device 10. The test device typically includes a pair of identical hinges composed of any material with suitable strength and durability for permitting upper and lower outer enclosures 12 and 14 to open and close. Hinge 54, for example, includes a lower element 56 and an upper element 58. Lower element 56 is attached to a mounting portion 55 molded into lower outer enclosure 12 through screws or other fasteners. Likewise, upper element 58 is attached to a mounting portion 57 molded into upper outer enclosure 14 through screws or other fasteners.

The hinges allow for rotation of upper outer enclosure 14 when test device 10 is opened. Also, instead of using gas springs as an assist mechanism, test device 10 can use spring-loaded hinges for assisting the user in opening test device 10 and maintaining it open. The spring-loaded hinges can be used alone or in conjunction with the gas springs. Other types of assist mechanisms, mounted either external or internal to test device 10, may also be used.

The side view in FIG. 3 also illustrates additional detail of hook 46 engaging cylindrical element 48 protruding from upper outer enclosure 14. In addition, this view further illustrates how handle 36 is mounted to pivot point 44 for rotational movement about pivot point 44.

As also shown in FIG. 3, connectors 60 on the back of test device 10 provide for a connection to a device under test or testing apparatus such as speakers and microphones, located within test device 10. Connectors 60 are further illustrated in the rear view shown in FIG. 4, and in this example connectors 60 include metal ports for passing electrical connections to the inside of test device 10. Also, the rear view illustrates a transfer plate 62, typically composed of a metallic material and mounted to the back of lower outer enclosure 12 through a plurality of closely-spaced screws or other fasteners, such as screws 59a, 59b, 59c, 59d, 59e, 59f, 59g, and 59h. The number and spacing of the fasteners is such as to provide sufficient force to ensure a good seal between transfer plate 62 and lower outer enclosure 12.

Transfer plate 62 in this example includes another connector 61 for connection to a device under test or testing apparatus located within test device 10. Use of transfer plate 62 provides the advantage of versatility and flexibility in testing. In particular, different types of transfer plates may exist for use with different types of connections for various testing options. These transfer plates may be easily interchanged through removal of fasteners 59a–59h and mounting of a different plate onto lower outer enclosure 12.

Figure 4:
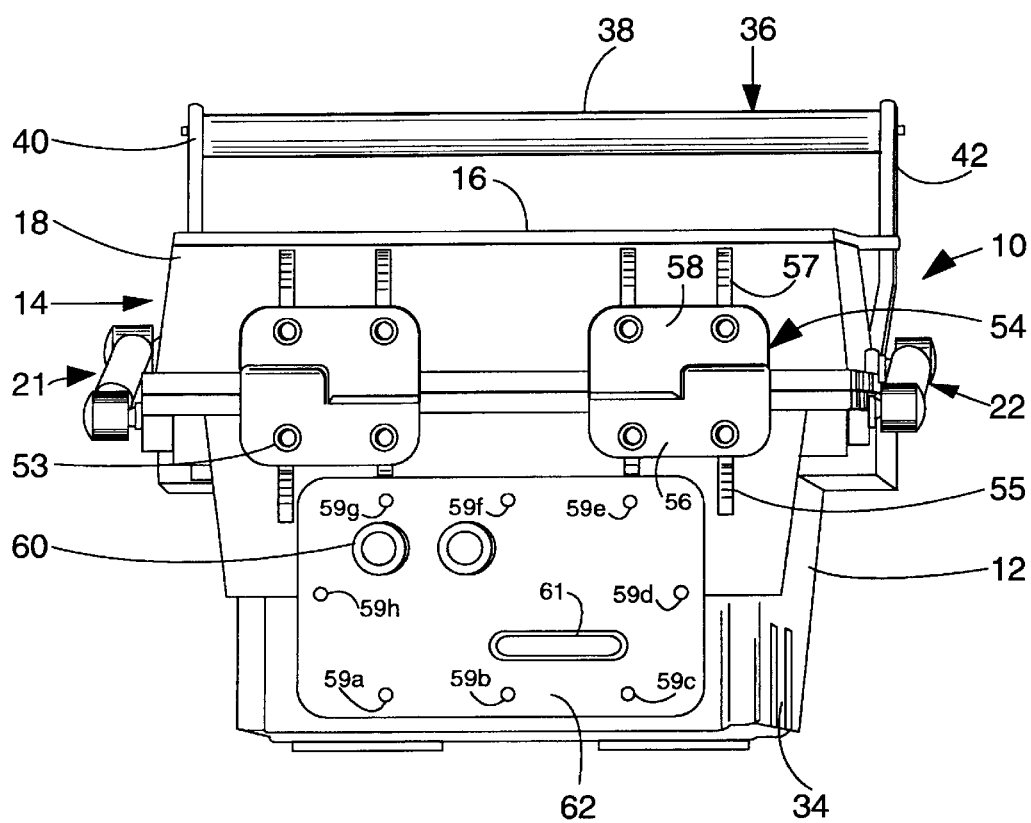
FIG. 4 is a rear view of the RF isolation test device.

The rear view shown in FIG. 4 also further illustrates attachment of hinge 54 and another hinge 53 mounted in, for example, an identical manner. Different types of hinges, and more or fewer hinges, may be used depending on a particular application.

Figure 5:
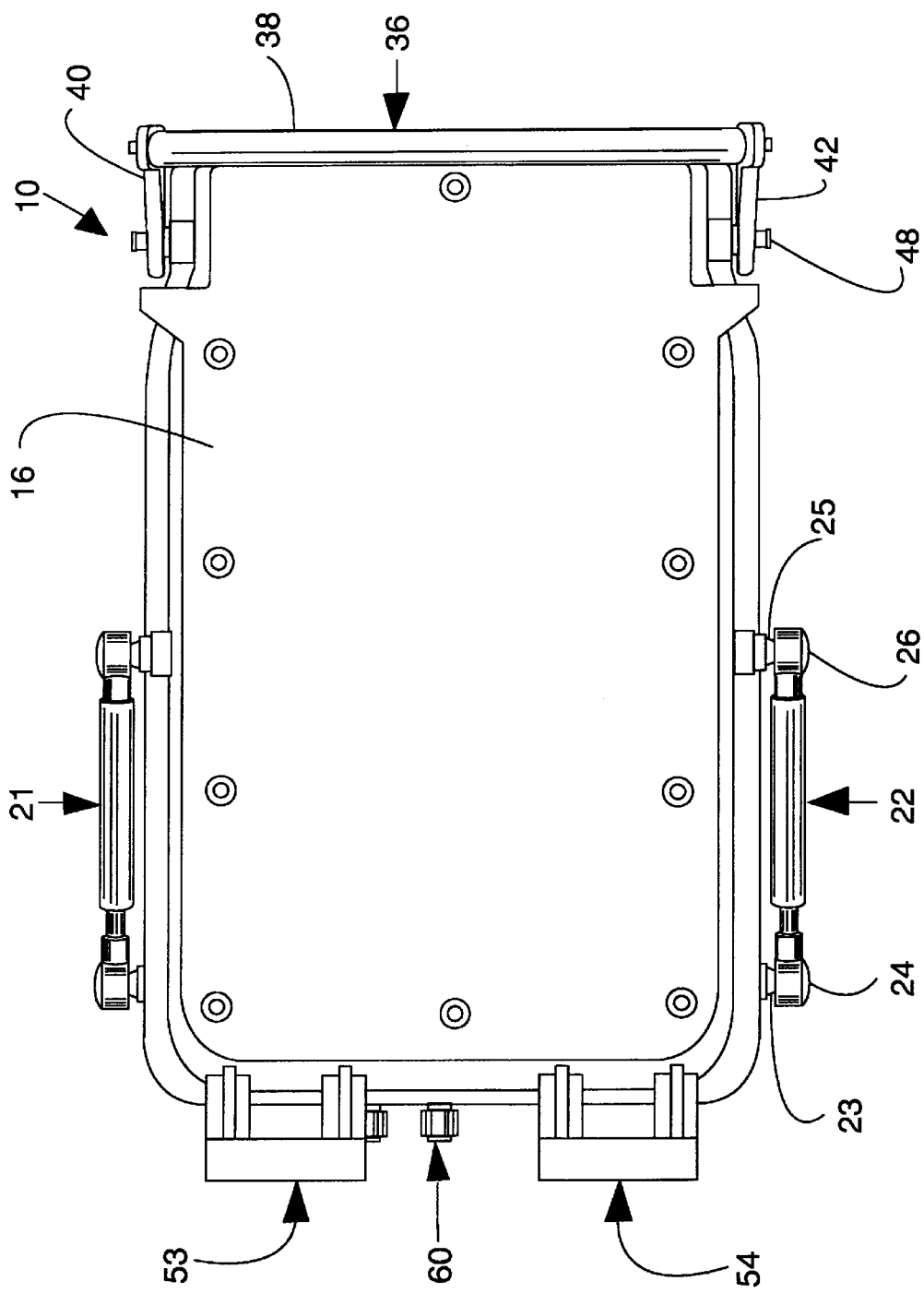
FIG. 5 is a top view of the RF isolation test device.
Figure 6:
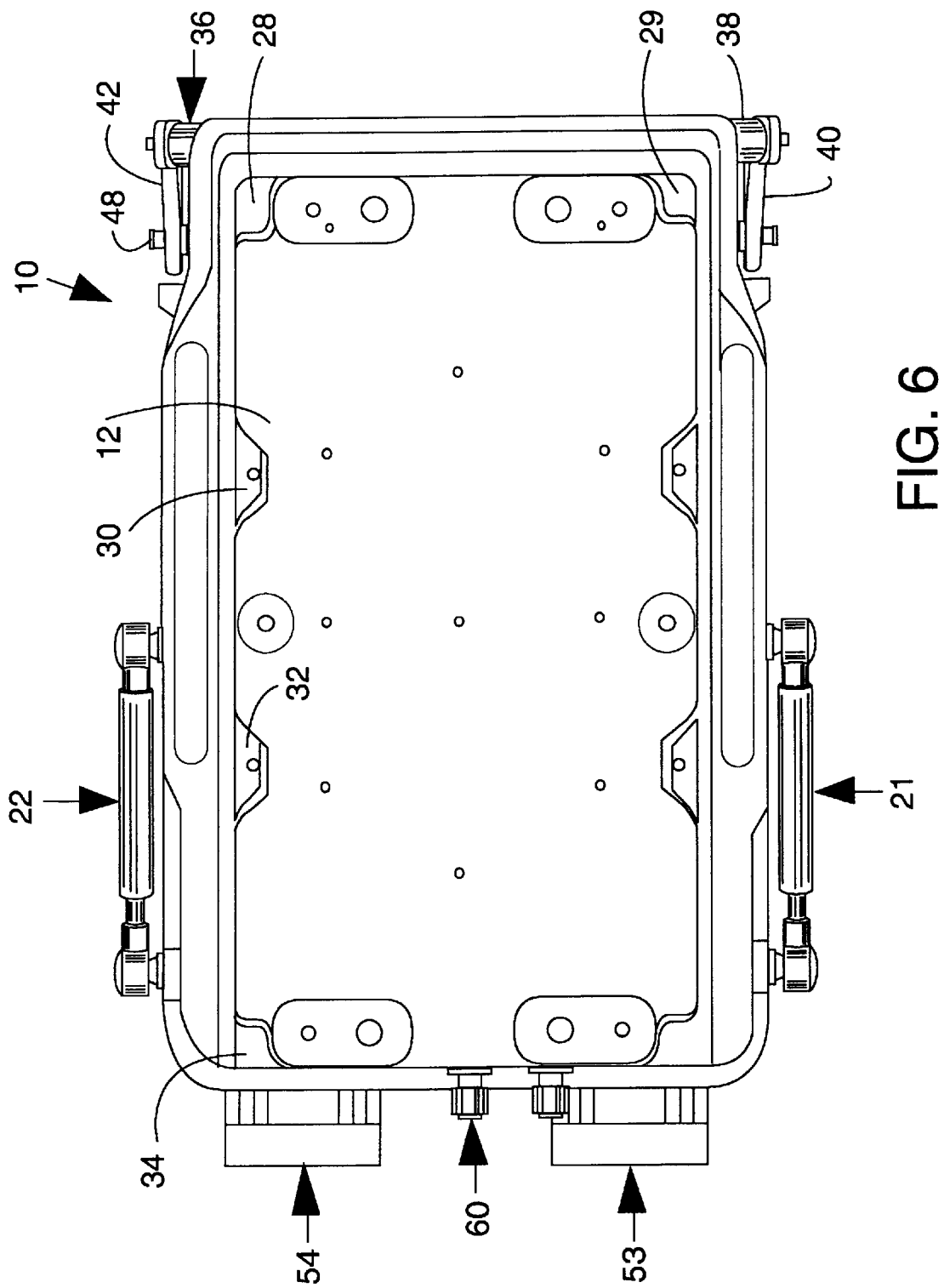
FIG. 6 is a bottom view of the RF isolation test device.

FIG. 5 is a top view of test device 10 that further illustrates mounting of cover 16 and attachment of gas springs 21 and 22, and attachment of hinges 53 and 54. FIG. 6 is a bottom view, which further illustrates indented portions 28, 29, 30, 32, and 34, and the indented portions hidden from view in FIG. 1. These indented portions are molded into lower outer enclosure 12. Lower outer enclosure 12 may include more or fewer such indented portions or not include any such portions. Therefore, outer enclosure can include a variable shape, meaning it does not necessarily have planar sides, in order to allow for molding of the indented portions to create mounting points, attachment of an open-close mechanism and an assist mechanism, attachment of the hinges, and other shapes or variations to allow for testing options.

Inner Enclosure

Figure 7:
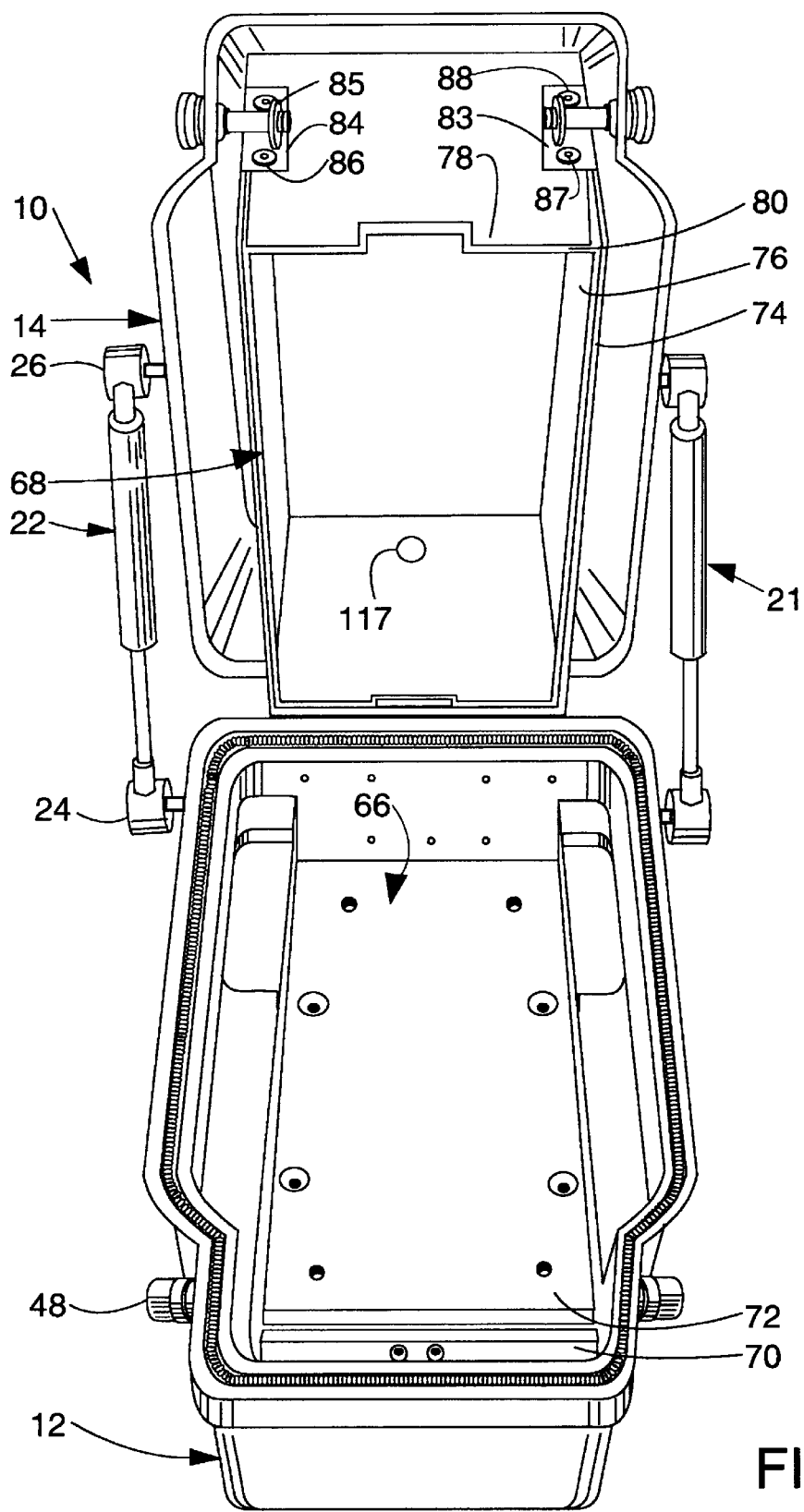
FIG. 7 is a perspective view of the RF isolation test device, showing the test device open.

FIG. 7 is a view illustrating test device 10 when open. As shown, test device 10 includes an inner enclosure composed of a lower inner enclosure 66 and an upper inner enclosure 68. Therefore, as mentioned above, test device 10 includes what is referred to as a "box within a box" configuration. The outer box is composed of lower outer enclosure 12 and upper outer enclosure 14. The inner enclosure is composed of lower inner enclosure 66 and upper inner enclosure 68. The "box within a box" configuration provides for a low resonance test environment and more effective RF shielding of a device under test.

Test device 10 also has what is referred to as a "clam shell" design with halves that open and close about hinges 53 and 54. One half of the clam shell includes lower outer enclosure 12 and lower inner enclosure 66. The other half includes upper outer enclosure 14 and upper inner enclosure 68. The use of the clam shell design permits the inner and outer enclosures to open wide about the hinges for ease of accessibility to the interior of the inner enclosure where a device under test would be located. This design also permits testing of larger products or devices under test.

The device under test is located within the inner enclosure and typically mounted on lower inner enclosure 66 through a use of a nest plate attached to lower inner enclosure 66. The inner enclosure provides for isolating the device under test in an environment substantially free from external RF energy to provide a low resonance test environment. In addition, the inner enclosure helps to dampen RF energy from the device under test and thus avoid interference caused by reflections of such energy within the testing environment. The outer enclosure provides for shielding of the device under test from external RF energy.

Both lower inner enclosure 66 and upper inner enclosure 68 of the inner enclosure include an external shielding material and an inner RF absorption material. The shielding material in this example includes a metallic box that provides physical support for the RF absorption material and also provides conductivity to further absorb and conduct RF energy. It can include any type of metallic material providing for RF shielding. The RF absorption material may include any material helping to dampen RF energy from the device under test to avoid or reduce interference from internal reflections of RF from the device under test and thus help to provide a non-reflective environment or a low resonance test environment. This exemplary embodiment uses for the RF absorption material a neoprene material having ferrite trapezoids that function as a magnetic lossy absorber.

Unlike the variable shape of the outer enclosure, the inner enclosure may include a regular configuration, meaning it has substantially planar sides. The regular shape of the shielding material of the inner enclosure provides a flat surface for ease of attaching the RF absorption material. Also, the flat surfaces may provide for better predictability and dampening of RF reflections inside the inner enclosure by allowing uniform enclosure on all six sides. The inner enclosure may alternatively have a variable configuration, and the outer enclosure may alternatively have a regular configuration. However, use of variable and regular configurations for, respectively, the outer and inner enclosures may provide the advantages identified above.

Lower inner enclosure 66 includes a metallic plate 70 on which is mounted an absorption material 72. Also, lower inner enclosure 66 is mounted within lower outer enclosure 12. Upper inner enclosure 68 is mounted to upper outer enclosure 14 and includes a box with one side open, as shown, that meets with lower inner enclosure 66. Upper inner enclosure 68 includes an external metallic box 74 inside of which is mounted an RF absorption material 76. Upper inner enclosure 68 also includes a front plate 78 mounted to brackets 83 and 84 through screws 85, 86, 87, and 88, or other fasteners. Front plate 78 includes a metallic plate on which is mounted an RF absorption material 80 on its inner surface facing inside upper inner enclosure 68.

Upper inner enclosure 68 need not necessarily include a removable front plate 78. However, it may include such plate for additional accessibility to the device under test. Front plate 78 may have a rectangular configuration, as shown, or other configurations depending upon a particular implementation and desired access to the inside of the inner enclosure, although providing for uniform coverage of absorption material can be important for particular applications. Alternatively, upper inner enclosure 68 can have an integral front without a removable front plate.

Figure 8:
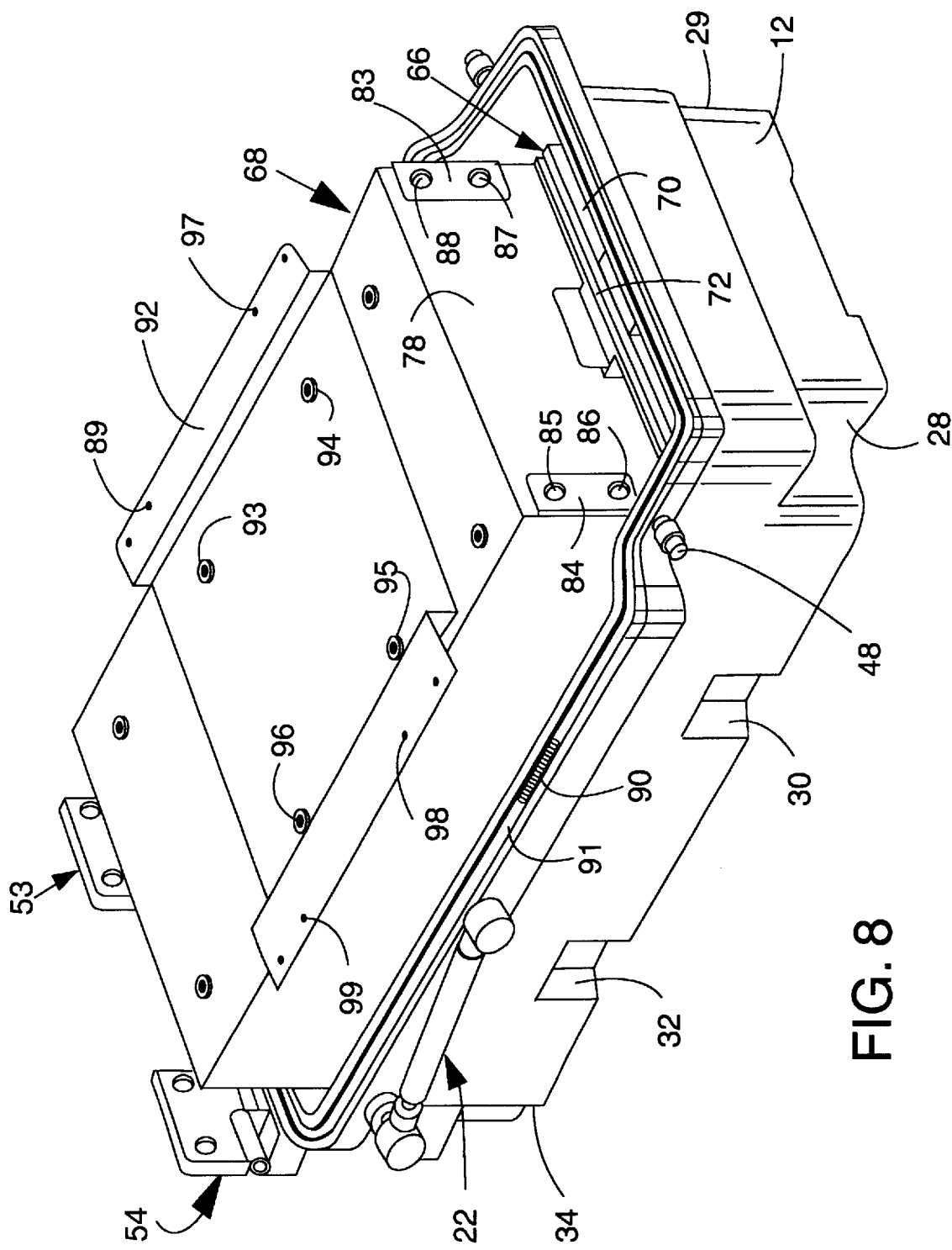
FIG. 8 is a perspective view of the RF isolation test device with an upper outer enclosure removed.

FIG. 8 is a perspective diagram providing additional detail of the inner enclosure by illustrating the RF isolation test device with upper outer enclosure 14 removed. As shown, upper inner enclosure 68 contacts or closely contacts lower inner enclosure 66 when test device 10 is closed. On the top of upper inner enclosure 68 is a mounting bracket 92 for attaching upper inner enclosure 68 to upper outer enclosure 14. Bracket 92 is mounted to upper inner enclosure 68 through screws 93, 94, 95, and 96, or other fasteners. Bracket 92 may then be mounted to the inside of upper outer enclosure 14 through fasteners within apertures 89, 97, 98, and 99. Bracket 92 may be formed from a metallic material.

Also, as shown is FIG. 8, lower outer enclosure 12 includes a channel 91. Located within channel 91 is an RF gasket 90 that extends throughout the entire channel on the entire periphery of lower outer enclosure 12 (see FIG. 7). RF gasket 90 is typically a wire mesh coil that provides for electrical conductivity between lower outer enclosure 12 and upper outer enclosure 14 when closed together in order to simulate a welded seam and provide for RF shielding. An RF gasket may include any type of metallic material providing conductivity between the enclosures for shielding.

Figure 9:
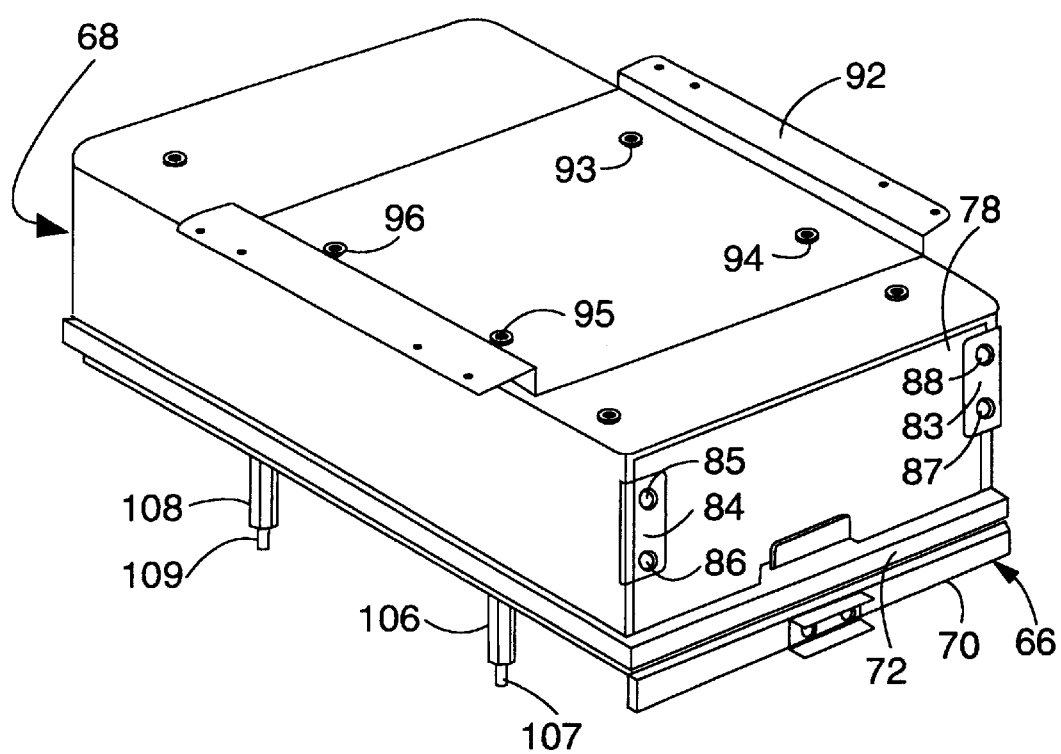
FIG. 9 is a perspective view of an inner enclosure for the RF isolation test device.
Figure 10:
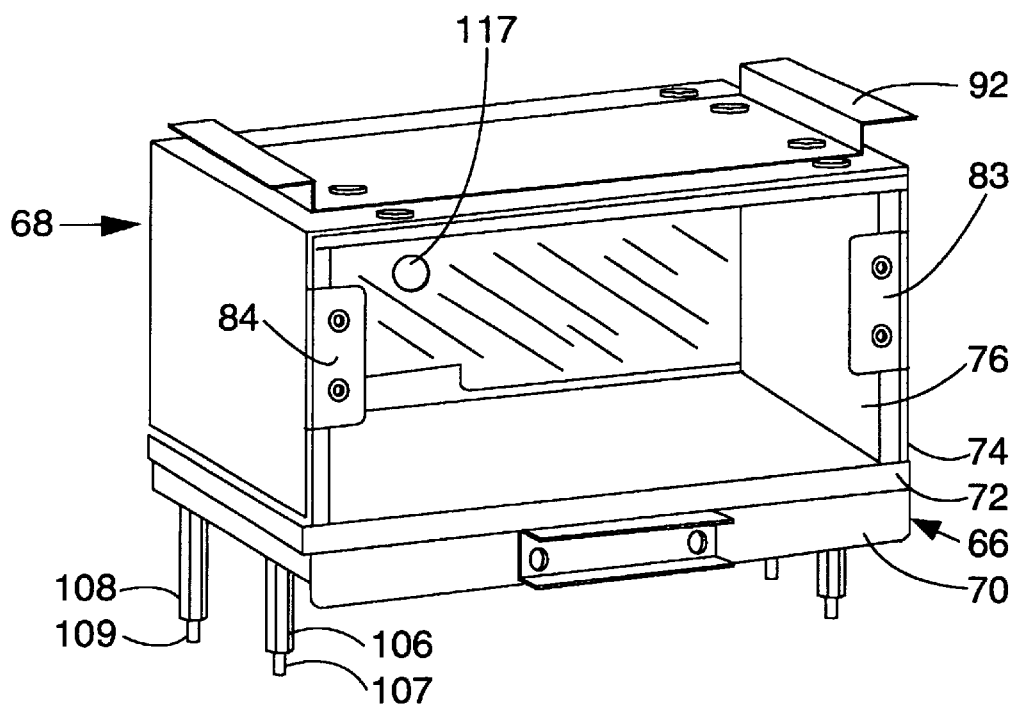
FIG. 10 is a perspective view of the inner enclosure with a front plate removed.

FIG. 9 is a perspective diagram of the inner enclosure illustrating it completely removed from the outer enclosure. FIG. 10 is a perspective diagram illustrating additional detail of the inner enclosure through removal of front plate 78. In use, the inner enclosure remains mounted within the outer enclosure, and it is shown removed to illustrate details of it. As shown in FIG. 10, the entire interior of upper inner enclosure 68 typically includes RF absorption material 76 mounted on, for example, metallic plate 74. FIGS. 9 and 10 also illustrate fasteners 106 and 108, including threaded portions 107 and 109, for attaching lower inner enclosure 66 to mounting points on the indented portions in lower outer enclosure 12.

Figure 11:
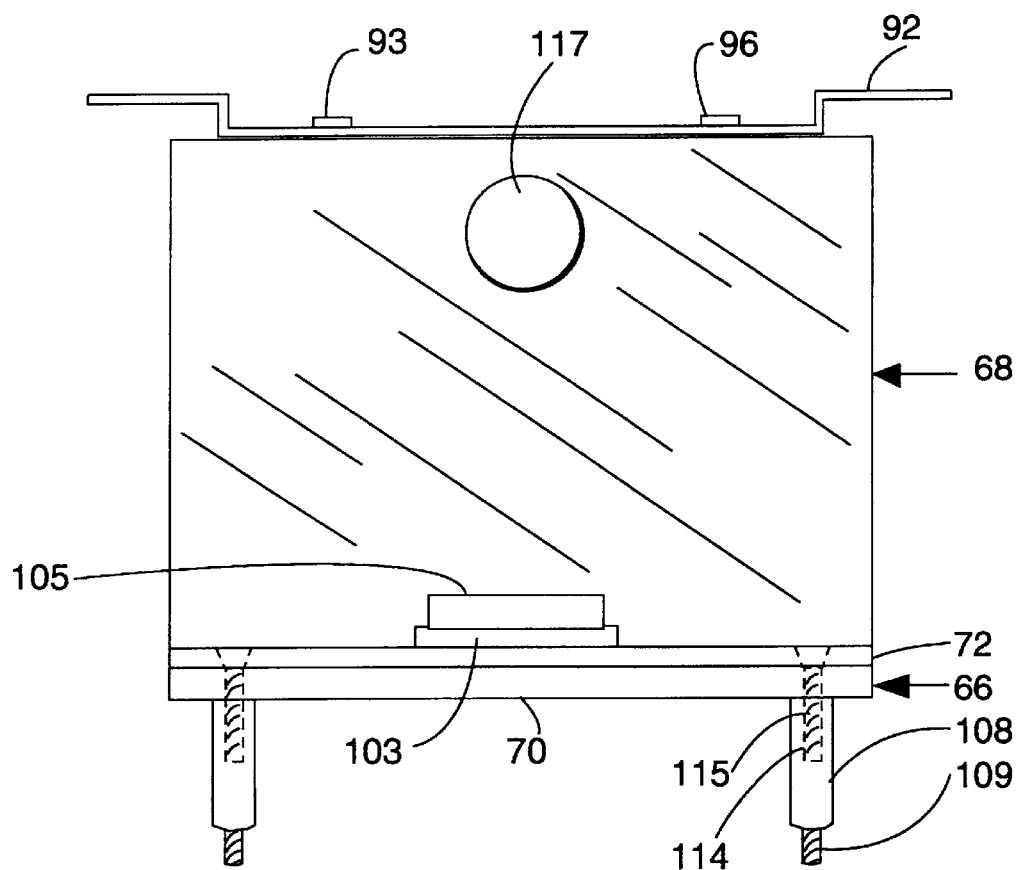
FIG. 11 is rear view of the inner enclosure.

FIG. 11 is a rear view of the inner enclosure illustrating additional details of it. In particular, FIG. 11 illustrates how fasteners, such as fastener 108 is attached to plate 70 through a screw 115 attached to a threaded aperture 114. Fastener 108 also includes threaded portion 109 for attachment to a threaded aperture in a mounting point within lower outer enclosure 12.

Also shown in FIG. 11 is an aperture 103 in both the rear metallic plate and RF absorption material for passing electrical connections into the inner enclosure for testing of a device under test nested within it. FIG. 11 also illustrates a cable access hole 117 in both the rear metallic plate and RF absorption material for routing electrical lines such as speaker and microphone cables. This hole 117 allows routing of cables from the inside of the inner enclosure to transfer plate 62. In use, the electrical connections pass through connectors 60, 61, or both in transfer plate 62 and then through apertures 103, 117, or both to a device under test or to apparatus for testing the device under test such as a customized nest plate. Alternatively, the inner enclosure can include other apertures for passing electrical connections to a device under test or testing apparatus. Element 105 represents a portion of the rear metallic plate folded over onto the outside surface of the rear plate in order to help create aperture 103.

Outer Enclosure and Mounting of Inner Enclosure

Figure 12:
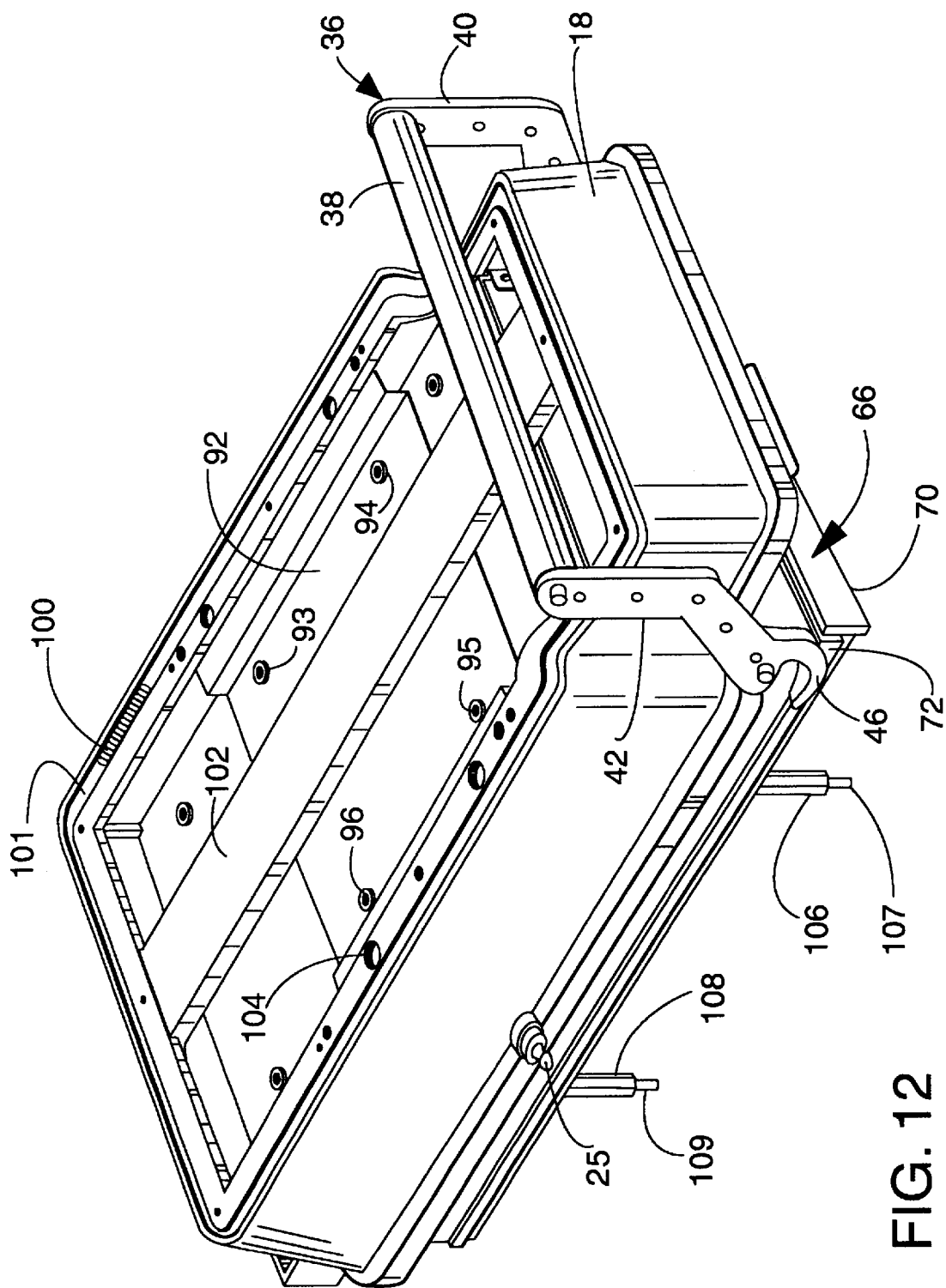
FIG. 12 is a perspective view of a portion of the upper outer enclosure, and the inner enclosure.

FIG. 12 illustrates additional detail of upper outer enclosure 14 through removal of cover 16. Upper outer enclosure 14 may include the removable cover for additional access to the inside of test device 10. Alternatively, upper outer enclosure 14 may be composed of a one-piece metallic material. As shown, portion 18 includes a channel 101 around the entire periphery and included within channel 101 is an RF gasket 100 that typically extends throughout the entire channel to provide for electrical conductivity between portion 18 and cover 16 to simulate a welded seam for RF shielding. Instead of using RF gasket 100, removable cover 16 could include a lip extending the periphery of its underside and fitting within channel 101 for conductivity. Portion 18 may include a bracket 102 for additional reinforcement and stability. Cover 16 may be mounted on portion 18 through screws or other fasteners that engage a plurality of apertures such as aperture 104. Bracket 102 may be formed from the same material as portion 18 and as a part of it. FIG. 12 also illustrates the plurality of fasteners, such as metal fasteners 106 and 108, which include corresponding screws 107 and 109 for attachment to mounting points within lower outer enclosure 12 as further explained below.

Figure 13:
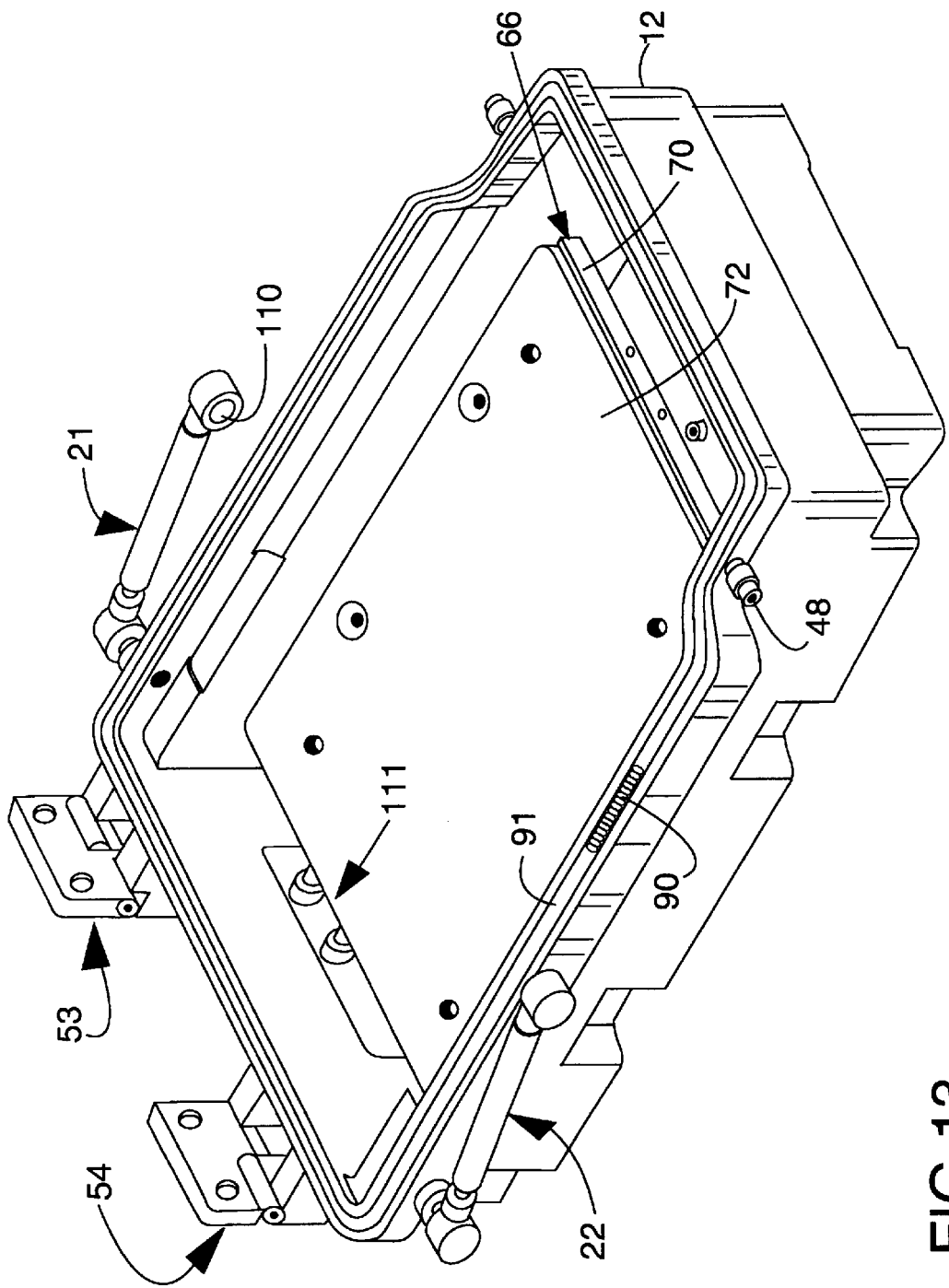
FIG. 13 is a perspective view of a lower outer enclosure for the RF isolation test device and including a lower inner enclosure.

FIG. 13 is a diagram further illustrating detail of lower inner enclosure 66 including plate 70 and RF absorption material 72. Together, plate 70 with absorption material 72 constitutes a base plate for use in accommodating a nest plate containing a device under test. Since the base plate includes a flat top surface, typically with threaded holes in standard locations, it provides a convenient platform for attaching many different types or configurations of nest plates for potentially testing many types or configurations of devices under test. A nest plate may be attached to the base plate, for example, using screws or other fasteners attached to the threaded holes. Also, as shown in FIG. 13, the transfer plate includes connector elements 111 that attach to connectors 60 that provide for connection to a device under test or testing apparatus on the inside of test device 10. The transfer plate would also include on its interior a connector element attached to connector 61. FIG. 13 further illustrates receptacle 110 of gas spring 21; receptacle 110 snaps onto a metal ball similar to element 25 but on the opposite side of upper outer enclosure 14.

Figure 14:
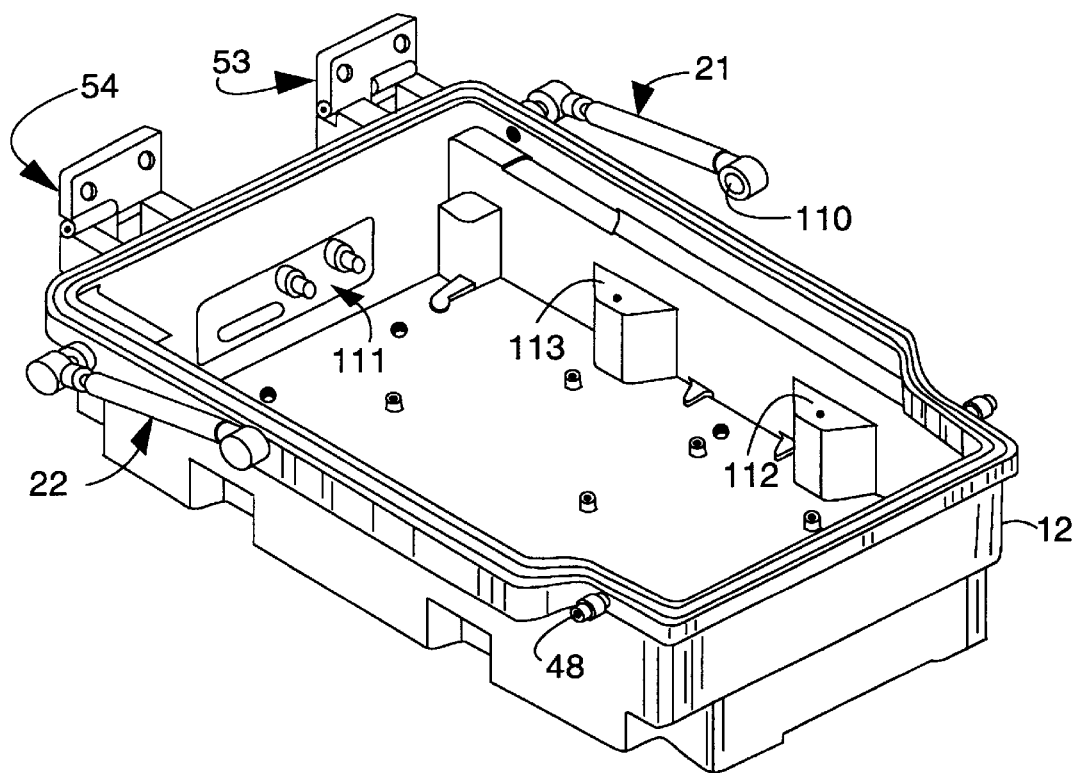
FIG. 14 is a perspective view of the lower outer enclosure.

FIG. 14 is a diagram illustrating additional detail of the inside of lower outer enclosure 12 with the inner enclosure completely removed for illustrative purposes. As shown, the indented portions cast into lower outer enclosure 12 provide for mounting points, such as points 112 and 113. A plurality of threaded portions such as screws 107 and 109 would connect with similar mounting points on the inside of lower outer enclosure 12 opposite mounting points 112 and 113. Therefore, in this example, lower inner enclosure 66 includes four fasteners, similar to fasteners 106 and 108, connected to four mounting points provided by four indented portions in lower outer enclosure 12 for attachment of lower inner enclosure 66.

Use of the RF Isolation Test Device

Test device 10 has many potential uses in testing of wireless or other devices requiring or benefitting from RF shielding during the testing. For testing, a user typically mounts a nest plate to the base plate and makes any required electrical connections, and the nest plate is configured to nest a particular type of device under test. The user places the device under test on the nest plate, closes test device 10, and performs a test of the device under test using external testing apparatus connected to the electrical connections. Following the test, the user may open test device 10, remove the device under test, place another similar device under test on the nest plate, close test device 10, and repeat the testing process. Therefore, use of test device 10 allows a user to quickly test similar devices, such as the same type or model of cellular telephone. In use, the test device is closed as shown in FIG. 1 and open as shown in FIG. 7.

For testing different types of devices, the user may remove the nest plate and mount another nest plate to the base plate. The other nest plate may be pre-configured for testing another type of device. The testing process can then be repeated with suitable electrical connections made to the nest plate or testing apparatus. The user may also change the transfer plate if different electrical connections are to be used for testing.

While the present invention has been described in connection with an exemplary embodiment, it will be understood that many modifications will be readily apparent to those skilled in the art, and this application is intended to cover any adaptations or variations thereof. For example, various configurations of the outer and inner enclosures and various types of shielding and other materials may be used without departing from the scope of the invention. This invention should be limited only by the claims and equivalents thereof.

What is claimed is:

1. A radio frequency (RF) isolation test device for shielding a device under test from RF energy, comprising:
   an upper outer enclosure;
   a lower outer enclosure mating with the upper outer enclosure, the upper and lower outer enclosures providing for RF shielding of a device under test located within the test device when the upper and lower outer enclosures are mated together;
   an RF absorption material located within the test device and at least partially surrounding the device under test when the upper and lower outer enclosures are mated together; and
   an open-close mechanism permitting the upper and lower outer enclosures to open for access within the test device and to close for testing of the device under test, the open-close mechanism including an assist mechanism that assists a user in opening and closing the test device.

2. The test device of claim 1 wherein the open-close mechanism includes:
   a hinge fastened to a first side of the upper and lower outer enclosures;
   a handle fastened to a second side, opposite the first side, of the upper outer enclosure; and
   an element located on a second side, opposite the first side, of the lower outer enclosure for engaging the handle when the test device is closed.

3. The test device of claim 2 wherein the handle includes a hook for engaging the element.

4. The test device of claim 3 wherein the handle is configured to apply pressure between the upper and lower outer enclosures when the hook engages the element.

5. The test device of claim 2 wherein the handle is configured to pivot in a first direction to open the test device and in a second direction to lock the upper and lower outer enclosures together.

6. The test device of claim 1 wherein the upper and lower outer enclosures are composed of a metallic material.

7. The test device of claim 1 wherein the assist mechanism includes a pair of gas springs fastened to opposing sides of the upper and lower outer enclosures.

8. The test device of claim 7 wherein the gas springs operate to maintain the test device open.

9. The test device of claim 7 wherein the gas springs operate to separate the upper and lower outer enclosures from the closed position to the open position.

10. The test device of claim 2 wherein the element includes a pin for engaging the hook.

11. A radio frequency (RF) isolation test device for shielding a device under test from RF energy, comprising:

an upper outer enclosure;

a lower outer enclosure mating with the upper outer enclosure, the upper and lower outer enclosures providing for RF shielding of a device under test located within the test device when the upper and lower outer enclosures are mated together;

an RF absorption material located within the test device and at least partially surrounding the device under test when the upper and lower outer enclosures are mated together; and a handle and a corresponding locking element, operably attached to the upper and lower outer enclosures, for use in opening the upper and lower outer enclosures and for locking closed the upper and lower outer enclosures in order to test the device under test located within the test device.

12. The test device of claim 11 wherein the locking element includes a pair of pins located on the lower outer enclosure.

13. The test device of claim 11, further including a hinge fastened to a first side of the upper and lower outer enclosures.

14. The test device of claim 12 wherein the handle includes a pair of hooks for engaging the pair of pins.

15. The test device of claim 14 wherein the handle is configured to apply pressure between the upper and lower outer enclosures when the pair of hooks engages the pair of pins.

16. The test device of claim 11 wherein the handle is configured to pivot in a first direction to open the test device and in a second direction to lock the upper and lower outer enclosures together.

17. The test device of claim 11 wherein the upper and lower outer enclosures are composed of a metallic material.

18. The test device of claim 11, further including a pair of gas springs fastened to opposing sides of the upper and lower outer enclosures.

19. The test device of claim 18 wherein the gas springs operate to maintain the test device open.

20. The test device of claim 18 wherein the gas springs operate to separate the upper and lower outer enclosures from the closed position to the open position when the handle disengages the locking element.

* * * * *